(12) United States Patent
Diwinsky et al.

(10) Patent No.: US 10,190,442 B2
(45) Date of Patent: Jan. 29, 2019

(54) GAS TURBINE IN SITU INFLATABLE BLADDERS FOR ON-WING REPAIR

(71) Applicant: General Electric Company, Schenectady, NY (US)

(72) Inventors: David Scott Diwinsky, West Chester, OH (US); Herbert Chidsey Roberts, Middletown, OH (US)

(73) Assignee: General Electric Company, Schenectady, NY (US)

( * ) Notice: Subject to any disclaimer, the term of this patent is extended or adjusted under 35 U.S.C. 154(b) by 163 days.

(21) Appl. No.: 15/077,123

(22) Filed: Mar. 22, 2016

(65) Prior Publication Data

US 2017/0276024 A1 Sep. 28, 2017

(51) Int. Cl.
*F01D 25/28* (2006.01)
*B23P 6/00* (2006.01)
(Continued)

(52) U.S. Cl.
CPC ............ *F01D 25/285* (2013.01); *B23P 6/002* (2013.01); *C23C 4/01* (2016.01); *C23C 4/02* (2013.01); *C23C 16/50* (2013.01); *F01D 5/005* (2013.01); *F01D 9/041* (2013.01); *F05D 2220/323* (2013.01); *F05D 2230/80* (2013.01); *F05D 2230/90* (2013.01)

(58) Field of Classification Search
CPC ........ F01D 25/285; F01D 5/005; F01D 9/041; C23C 4/01; C23C 4/02; C23C 16/50; B23P 6/002; F05D 2230/80; F05D 2230/90; F05D 220/323
See application file for complete search history.

(56) References Cited

U.S. PATENT DOCUMENTS

| 4,910,823 A | 3/1990 | Silverman et al. |
| 5,344,284 A | 9/1994 | Delvaux et al. |

(Continued)

FOREIGN PATENT DOCUMENTS

| CN | 102794908 A | 11/2012 |
| EP | 1652954 A1 | 5/2006 |

(Continued)

OTHER PUBLICATIONS

Extended European Search Report and Opinion issued in connection with corresponding EP Application No. 17162176.6 dated Aug. 25, 2017.

(Continued)

*Primary Examiner* — Moshe Wilensky
(74) *Attorney, Agent, or Firm* — General Electric Company; Brian Overbeck

(57) ABSTRACT

Methods are provided for repairing a surface of a component within a gas turbine engine. A first bladder and a second bladder can be installed (simultaneously or independently) within the gas turbine engine. The first bladder and the second bladder can then be inflated with an inflating fluid to form a first circumferential seal and a second circumferential seal to define an isolated area within the gas turbine engine. All the surfaces within the isolated area can then be coated with a masking layer. At least a portion of the masking layer can then be removed to expose a working area, and a coating can be formed on the working area.

19 Claims, 7 Drawing Sheets

(51) Int. Cl.
*C23C 16/50* (2006.01)
*F01D 9/04* (2006.01)
*C23C 4/02* (2006.01)
*F01D 5/00* (2006.01)
*C23C 4/01* (2016.01)

(56) References Cited

U.S. PATENT DOCUMENTS

| | | |
|---|---|---|
| 5,644,394 A | 7/1997 | Owens |
| 5,915,743 A | 6/1999 | Palma |
| 6,126,089 A | 10/2000 | Williamson et al. |
| 6,235,352 B1 | 5/2001 | Leverant et al. |
| 6,390,383 B1 | 5/2002 | Fusaro, Jr. et al. |
| 6,973,978 B2 | 12/2005 | Cravatte |
| 7,146,725 B2 | 12/2006 | Kottilingam et al. |
| 7,278,208 B2 | 10/2007 | Le Saint et al. |
| 8,067,711 B2 | 11/2011 | Blankenship et al. |
| 8,191,504 B2 | 6/2012 | Blankenship et al. |
| 8,290,006 B1 | 10/2012 | Gradl et al. |
| 8,362,386 B2 | 1/2013 | Lau et al. |
| 8,822,874 B2 | 9/2014 | Zajchowski et al. |
| 9,085,053 B2 | 7/2015 | Tholen et al. |
| 9,163,322 B2 | 10/2015 | DiMascio et al. |
| 2006/0141158 A1 | 6/2006 | Das et al. |
| 2008/0264547 A1 | 10/2008 | Raab et al. |
| 2009/0208662 A1 | 10/2009 | Blankenship et al. |
| 2011/0206533 A1 | 8/2011 | Lee et al. |
| 2012/0024457 A1 | 2/2012 | Ramm et al. |
| 2012/0244289 A1 | 9/2012 | Blankenship |
| 2014/0352483 A1 | 12/2014 | Robert, III et al. |
| 2014/0356109 A1 | 12/2014 | Whittenberger et al. |
| 2015/0197712 A1* | 7/2015 | Ekanayake ......... C11D 11/0041 427/299 |
| 2016/0032743 A1 | 2/2016 | Duchaine |
| 2016/0067750 A1 | 3/2016 | Griffiths et al. |
| 2017/0145916 A1 | 5/2017 | Stuart |
| 2017/0292380 A1 | 10/2017 | Diwinsky et al. |

FOREIGN PATENT DOCUMENTS

| | | |
|---|---|---|
| EP | 1743951 A2 | 1/2007 |
| EP | 1749583 A1 | 2/2007 |

OTHER PUBLICATIONS

Chidsey, H.R., et al., Situ Gas Turbine Prevention of Crack Growth Progression, GE Co-Pending U.S. Appl. No. 15/014,115, filed Feb. 3, 2016.

Machine Translation and a copy of Chinese Office Action issued in connection with corresponding CN Application No. 201710173843.5 dated Jul. 3, 2018.

\* cited by examiner

GAS TURBINE IN SITU INFLATABLE BLADDERS FOR ON-WING REPAIR

FIELD OF THE INVENTION

The present subject matter relates generally to gas turbine engines and, more particularly, to a system and method for performing an in situ repair of an internal component of a gas turbine engine.

BACKGROUND OF THE INVENTION

A gas turbine engine typically includes a turbomachinery core having a high pressure compressor, combustor, and high pressure turbine in serial flow relationship. The core is operable in a known manner to generate a primary gas flow. The high pressure compressor includes annular arrays ("rows") of stationary vanes that direct air entering the engine into downstream, rotating blades of the compressor. Collectively one row of compressor vanes and one row of compressor blades make up a "stage" of the compressor. Similarly, the high pressure turbine includes annular rows of stationary nozzle vanes that direct the gases exiting the combustor into downstream, rotating blades of the turbine. Collectively one row of nozzle vanes and one row of turbine blades make up a "stage" of the turbine. Typically, both the compressor and turbine include a plurality of successive stages.

Gas turbine engines, particularly aircraft engines, require a high degree of periodic maintenance. For example, periodic maintenance is often scheduled to allow internal components of the engine to be inspected for defects and subsequently repaired. Unfortunately, many conventional repair methods used for aircraft engines require that the engine be removed from the body of the aircraft and subsequently partially or fully disassembled. As such, these repair methods result in a significant increase in both the time and the costs associated with repairing internal engine components.

However, performing in situ service or repair procedures on gas turbines is complicated because some of the repair or service procedures can unintentionally harm portions of the gas turbine due to fluid or gas based over spray, weld splatter, or waste partials during material removal operations. Accordingly, a system and method for performing an in situ repair of an internal component of a gas turbine engine would be welcomed within the technology.

BRIEF DESCRIPTION OF THE INVENTION

Aspects and advantages of the invention will be set forth in part in the following description, or may be obvious from the description, or may be learned through practice of the invention.

Methods are generally provided for repairing a surface of a component within a gas turbine engine. In one embodiment, a first bladder and a second bladder are installed (simultaneously or independently) within the gas turbine engine. The first bladder and the second bladder can then be inflated with an inflating fluid to form a first circumferential seal and a second circumferential seal to define an isolated area within the gas turbine engine. All the surfaces within the isolated area can then be coated with a masking layer. At least a portion of the masking layer can then be removed to expose a working area, and a coating can be formed on the working area.

In another embodiment, the method can include installing a first bladder and a second bladder (simultaneously or independently) within the gas turbine engine. The first bladder and the second bladder can then be inflated with an inflating fluid to form a first circumferential seal and a second circumferential seal to define an isolated area within the gas turbine engine. Then, the gas turbine engine can be cleaned within the isolated area.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended Figs., in which.

Figure 1:
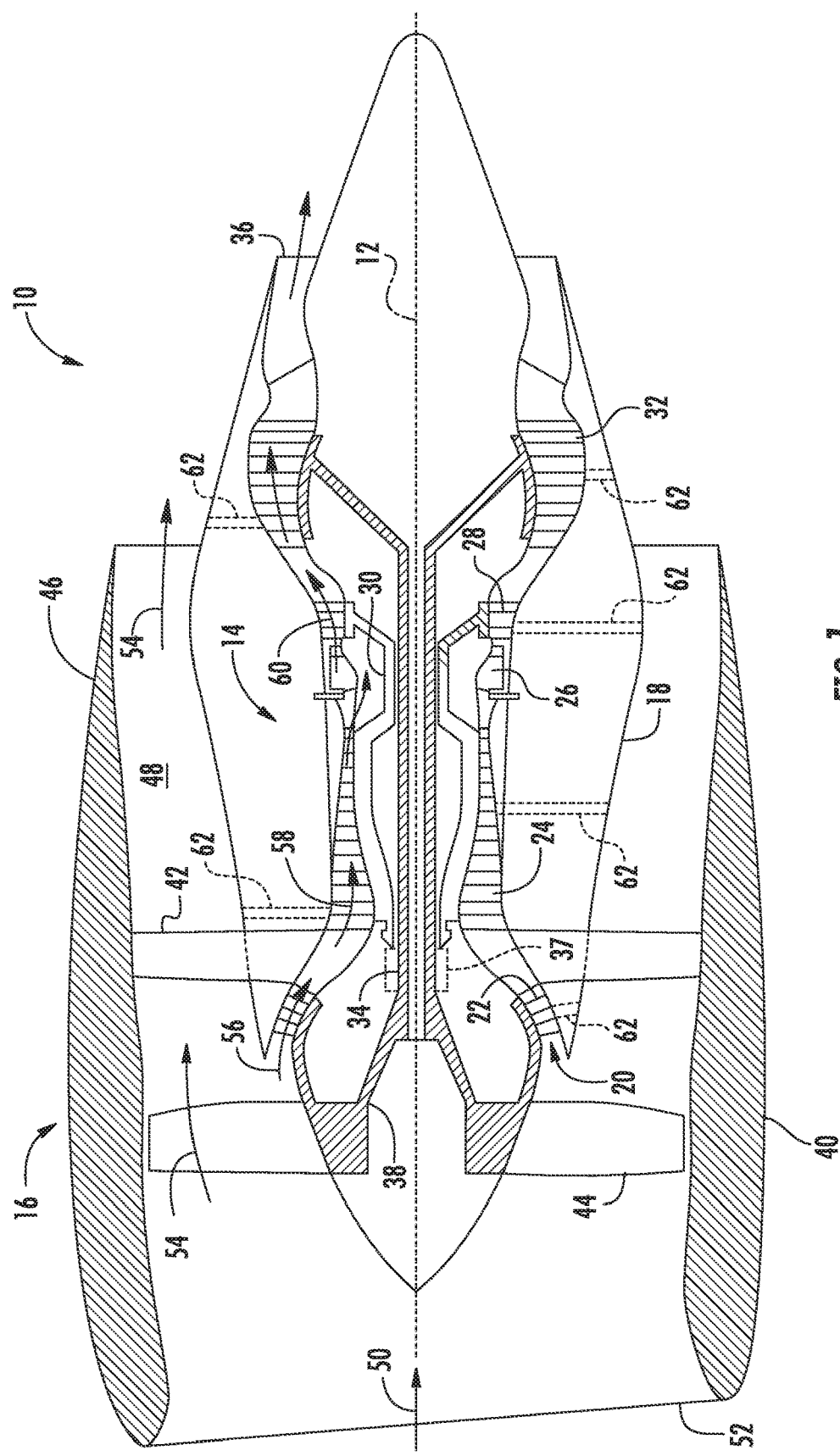
FIG. 1 illustrates a cross-sectional view of one embodiment of a gas turbine engine that may be utilized within an aircraft in accordance with aspects of the present subject matter.

Repeat use of reference characters in the present specification and drawings is intended to represent the same or analogous features or elements of the present invention.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first", "second", and "third" may be used interchangeably to distinguish one component from another and are not intended to signify location or importance of the individual components.

The terms "upstream" and "downstream" refer to the relative direction with respect to fluid flow in a fluid pathway. For example, "upstream" refers to the direction from which the fluid flows, and "downstream" refers to the direction to which the fluid flows.

In general, a system and method is provided for performing an in situ repair of an internal component of a gas turbine engine. In one embodiment, an inflatable bladder can be utilized to form a circumferential seal within the gas turbine. Once inflated, the inflatable bladder can form a temporary barrier inside the gas turbine. Having the ability to set up a temporary barrier inside the gas turbine can help reduce the risk of harming unintended regions of the gas turbine during in situ repair. In particular embodiments, for example, two or more barriers can be used to establish an isolated area within the engine. For example, the isolated area can be a washing zone, deposition zone, or other work zone inside the gas turbine. In one embodiment, the washing zone can be exposed to rinsing and washing fluids, solvents, and soaps, to locally fill the gas turbine to wash a large region of the gas turbine, while limiting the rinsing and washing from reaching other regions of the gas turbine.

In several embodiments, the system may include a repair tool configured to be inserted through an access port of the gas turbine engine. For example, the repair tool can allow a repair tip or tip end of the tool to be positioned adjacent to a defect of an internal component of the engine, such as a crack, void, distressed area or any other defect defining a fillable volume. As will be described below, the repair tool may be temporarily attached to the surface of the component using an inflated bladder, allowing precision work to be performed on the component. For example, the repair tool can supply a new material and/or a heating element to fill and fuse new material within the crack to repair the defect.

It should be appreciated that the disclosed system and method may generally be used to perform in situ repairs of internal components located within any suitable type of gas turbine engine, including aircraft-based turbine engines and land-based turbine engines, regardless of the engine's current assembly state (e.g., fully or partially assembled). Additionally, with reference to aircraft engines, it should be appreciated that the present subject matter may be implemented on-wing or off-wing.

Referring now to the drawings, FIG. 1 illustrates a cross-sectional view of one embodiment of a gas turbine engine 10 that may be utilized within an aircraft in accordance with aspects of the present subject matter, with the engine 10 being shown having a longitudinal or axial centerline axis 12 extending therethrough for reference purposes. In general, the engine 10 may include a core gas turbine engine (indicated generally by reference character 14) and a fan section 16 positioned upstream thereof. The core engine 14 may generally include a substantially tubular outer casing 18 that defines an annular inlet 20. In addition, the outer casing 18 may further enclose and support a booster compressor 22 for increasing the pressure of the air that enters the core engine 14 to a first pressure level. A high pressure, multi-stage, axial-flow compressor 24 may then receive the pressurized air from the booster compressor 22 and further increase the pressure of such air. The pressurized air exiting the high-pressure compressor 24 may then flow to a combustor 26 within which fuel is injected into the flow of pressurized air, with the resulting mixture being combusted within the combustor 26. The high energy combustion products are directed from the combustor 26 along the hot gas path of the engine 10 to a first (high pressure) turbine 28 for driving the high pressure compressor 24 via a first (high pressure) drive shaft 30, and then to a second (low pressure) turbine 32 for driving the booster compressor 22 and fan section 16 via a second (low pressure) drive shaft 34 that is generally coaxial with first drive shaft 30. After driving each of turbines 28 and 32, the combustion products may be expelled from the core engine 14 via an exhaust nozzle 36 to provide propulsive jet thrust.

Additionally, as shown in FIG. 1, the fan section 16 of the engine 10 may generally include a rotatable, axial-flow fan rotor assembly 38 that is configured to be surrounded by an annular fan casing 40. It should be appreciated by those of ordinary skill in the art that the fan casing 40 may be configured to be supported relative to the core engine 14 by a plurality of substantially radially-extending, circumferentially-spaced outlet guide vanes 42. As such, the fan casing 40 may enclose the fan rotor assembly 38 and its corresponding fan rotor blades 44. Moreover, a downstream section 46 of the fan casing 40 may extend over an outer portion of the core engine 14 so as to define a secondary, or by-pass, airflow conduit 48 that provides additional propulsive jet thrust.

It should be appreciated that, in several embodiments, the second (low pressure) drive shaft 34 may be directly coupled to the fan rotor assembly 38 to provide a direct-drive configuration. Alternatively, the second drive shaft 34 may be coupled to the fan rotor assembly 38 via a speed reduction device 37 (e.g., a reduction gear or gearbox) to provide an indirect-drive or geared drive configuration. Such a speed reduction device(s) may also be provided between any other suitable shafts and/or spools within the engine 10 as desired or required.

During operation of the engine 10, it should be appreciated that an initial air flow (indicated by arrow 50) may enter the engine 10 through an associated inlet 52 of the fan casing 40. The air flow 50 then passes through the fan blades 44 and splits into a first compressed air flow (indicated by arrow 54) that moves through conduit 48 and a second compressed air flow (indicated by arrow 56) which enters the booster compressor 22. The pressure of the second compressed air flow 56 is then increased and enters the high pressure compressor 24 (as indicated by arrow 58). After mixing with fuel and being combusted within the combustor 26, the combustion products 60 exit the combustor 26 and flow through the first turbine 28. Thereafter, the combustion products 60 flow through the second turbine 32 and exit the exhaust nozzle 36 to provide thrust for the engine 10.

The gas turbine engine 10 may also include a plurality of access ports defined through its casings and/or frames for providing access to the interior of the core engine 14. For instance, as shown in FIG. 1, the engine 10 may include a plurality of access ports 62 (only six of which are shown) defined through the outer casing 18 for providing internal access to one or both of the compressors 22, 24 and/or for providing internal access to one or both of the turbines 28, 32. In several embodiments, the access ports 62 may be spaced apart axially along the core engine 14. For instance, the access ports 62 may be spaced apart axially along each compressor 22, 24 and/or each turbine 28, 32 such that at least one access port 62 is located at each compressor stage and/or each turbine stage for providing access to the internal components located at such stage(s). In addition, the access ports 62 may also be spaced apart circumferentially around the core engine 14. For instance, a plurality of access ports 62 may be spaced apart circumferentially around each compressor stage and/or turbine stage.

It should be appreciated that, although the access ports 62 are generally described herein with reference to providing internal access to one or both of the compressors 22, 24 and/or for providing internal access to one or both of the turbines 28, 32, the gas turbine engine 10 may include access ports 62 providing access to any suitable internal location of the engine 10, such as by including access ports 62 that provide access within the combustor 26 and/or any other suitable component of the engine 10.

Figure 2:
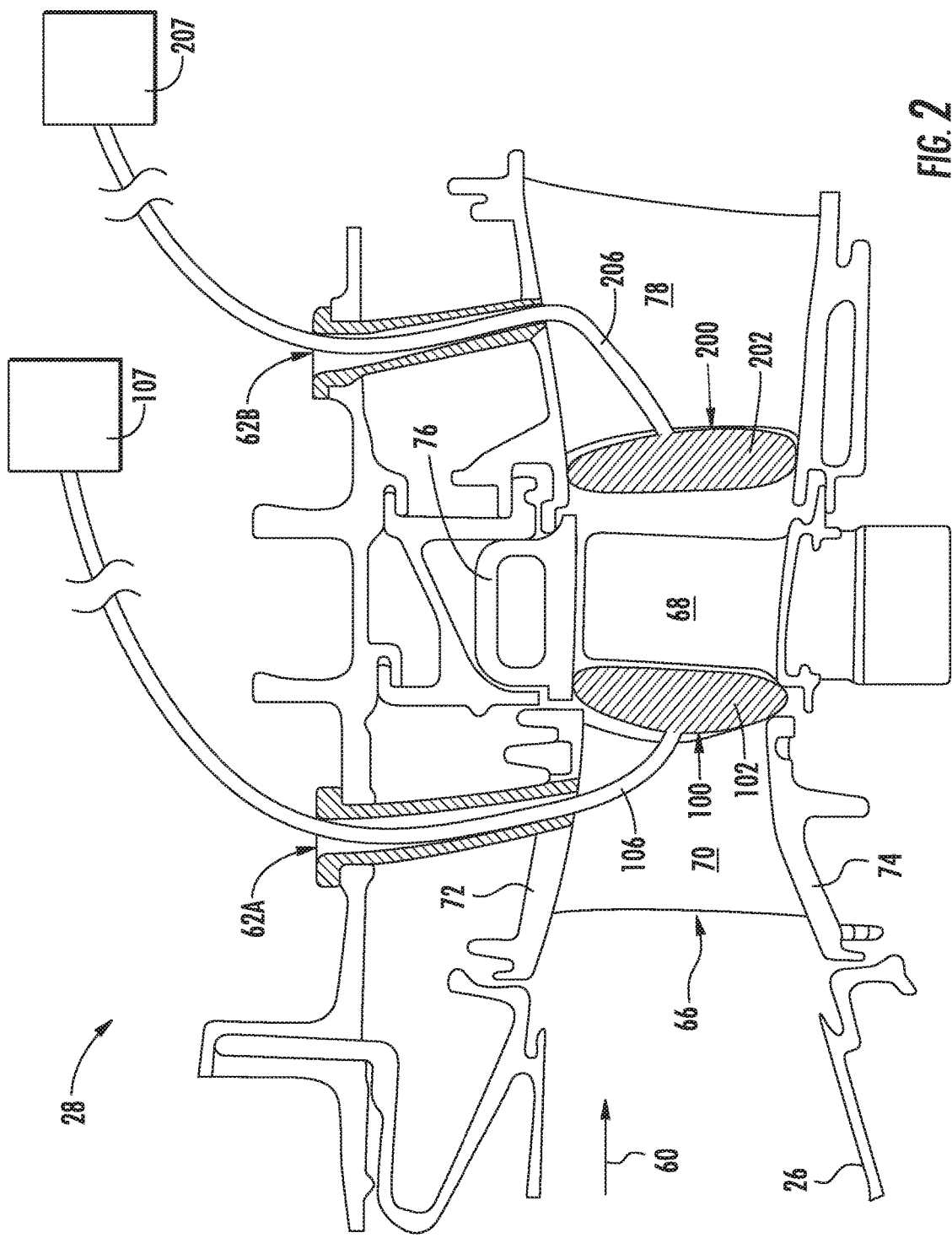
FIG. 2 illustrates a partial, cross-sectional view of one embodiment of a turbine suitable for use within the gas turbine engine shown in FIG. 1, particularly illustrating access ports defined in the engine for providing internal access to the turbine.

Referring now to FIG. 2, a partial, cross-sectional view of the first (or high pressure) turbine 28 described above with reference to FIG. 1 is illustrated in accordance with embodiments of the present subject matter. As shown, the first turbine 28 may include a first stage turbine nozzle 66 and an annular array of rotating turbine blades 68 (one of which is shown) located immediately downstream of the nozzle 66. The nozzle 66 may generally be defined by an annular flow channel that includes a plurality of radially-extending, circularly-spaced nozzle vanes 70 (one of which is shown). The vanes 70 may be supported between a number of arcuate outer bands 72 and arcuate inner bands 74. Additionally, the circumferentially spaced turbine blades 68 may generally be configured to extend radially outwardly from a rotor disk (not shown) that rotates about the centerline axis 12 (FIG. 1) of the engine 10. Moreover, a turbine shroud 76 may be positioned immediately adjacent to the radially outer tips of the turbine blades 68 so as to define the outer radial flowpath boundary for the combustion products 60 flowing through the turbine 28 along the hot gas path of the engine 10.

As indicated above, the turbine 28 may generally include any number of turbine stages, with each stage including an annular array of nozzle vanes and follow-up turbine blades 68. For example, as shown in FIG. 2, an annular array of nozzle vanes 78 of a second stage of the turbine 28 may be located immediately downstream of the turbine blades 68 of the first stage of the turbine 28.

Moreover, as shown in FIG. 2, a plurality of access ports 62 may be defined through the turbine casing and/or frame, with each access port 62 being configured to provide access to the interior of the turbine 28 at a different axial location. Specifically, as indicated above, the access ports 62 may, in several embodiments, be spaced apart axially such that each access port 62 is aligned with or otherwise provides interior access to a different stage of the turbine 28. For instance, as shown in FIG. 2, a first access port 62A may be defined through the turbine casing/frame to provide access to the first stage of the turbine 28 while a second access port 62B may be defined through the turbine casing/frame to provide access to the second stage of the turbine 28.

It should be appreciated that similar access ports 62 may also be provided for any other stages of the turbine 28 and/or for any turbine stages of the second (or low pressure) turbine 32. It should also be appreciated that, in addition to the axially spaced access ports 62 shown in FIG. 2, access ports 62 may be also provided at differing circumferentially spaced locations. For instance, in one embodiment, a plurality of circumferentially spaced access ports may be defined through the turbine casing/frame at each turbine stage to provide interior access to the turbine 28 at multiple circumferential locations around the turbine stage.

At least one bladder can be installed within the engine to form a circumferential seal therein. Referring to FIG. 2, a first bladder 100 is installed and positioned between the plurality of first stage turbine nozzles 66 and the annular array of rotating turbine blades 68. For example, the first bladder 100 may be installed by inserting the first bladder 100, in an uninflated state, through one of the access ports 62. Then, the first bladder 100 can be inflated using an inflating fluid, such as a liquid, foam, a gas.

Referring now to FIG. 3, a partial, cross-sectional view of the high pressure compressor 24 described above with reference to FIG. 1 is illustrated in accordance with embodiments of the present subject matter. As shown, the compressor 24 may include a plurality of compressor stages, with each stage including both an annular array of fixed compressor vanes 80 (only one of which is shown for each stage) and an annular array of rotatable compressor blades 82 (only one of which is shown for each stage). Each row of compressor vanes 80 is generally configured to direct air flowing through the compressor 24 to the row of compressor blades 82 immediately downstream thereof.

Moreover, the compressor 24 may include a plurality of access ports 62 defined through the compressor casing/frame, with each access port 62 being configured to provide access to the interior of the compressor 24 at a different axial location. Specifically, in several embodiments, the access ports 62 may be spaced apart axially such that each access port 62 is aligned with or otherwise provides interior access to a different stage of the compressor 24. For instance, as shown in FIG. 3, first, second, third and fourth access ports 62a, 62b, 62c, 62d are illustrated that provide access to four successive stages, respectively, of the compressor 24.

It should be appreciated that similar access ports 62 may also be provided for any of the other stages of the compressor 24 and/or for any of the stages of the low pressure compressor 22. It should also be appreciated that, in addition to the axially spaced access ports 62 shown in FIG. 3, access ports 62 may be also provided at differing circumferentially spaced locations. For instance, in one embodiment, a plurality of circumferentially spaced access ports may be defined through the compressor casing/frame at each compressor stage to provide interior access to the compressor 24 at multiple circumferential locations around the compressor stage.

Similar to the embodiment shown in FIG. 2, a first bladder 100 is installed and positioned within two compressor stages (i.e., between a first annular array of fixed compressor vanes 80 and a first annular array of rotatable compressor blades 82). A second bladder 200 is installed and positioned within two compressor stages (i.e., between a first annular array of fixed compressor vanes 80 and a first annular array of rotatable compressor blades 82). As such, the first bladder 100 and the second bladder 200 may, after inflating, seal the area therebetween to isolate that area from the other areas of the engine for local work (e.g., cleaning, coating, etc.).

Figure 3A:
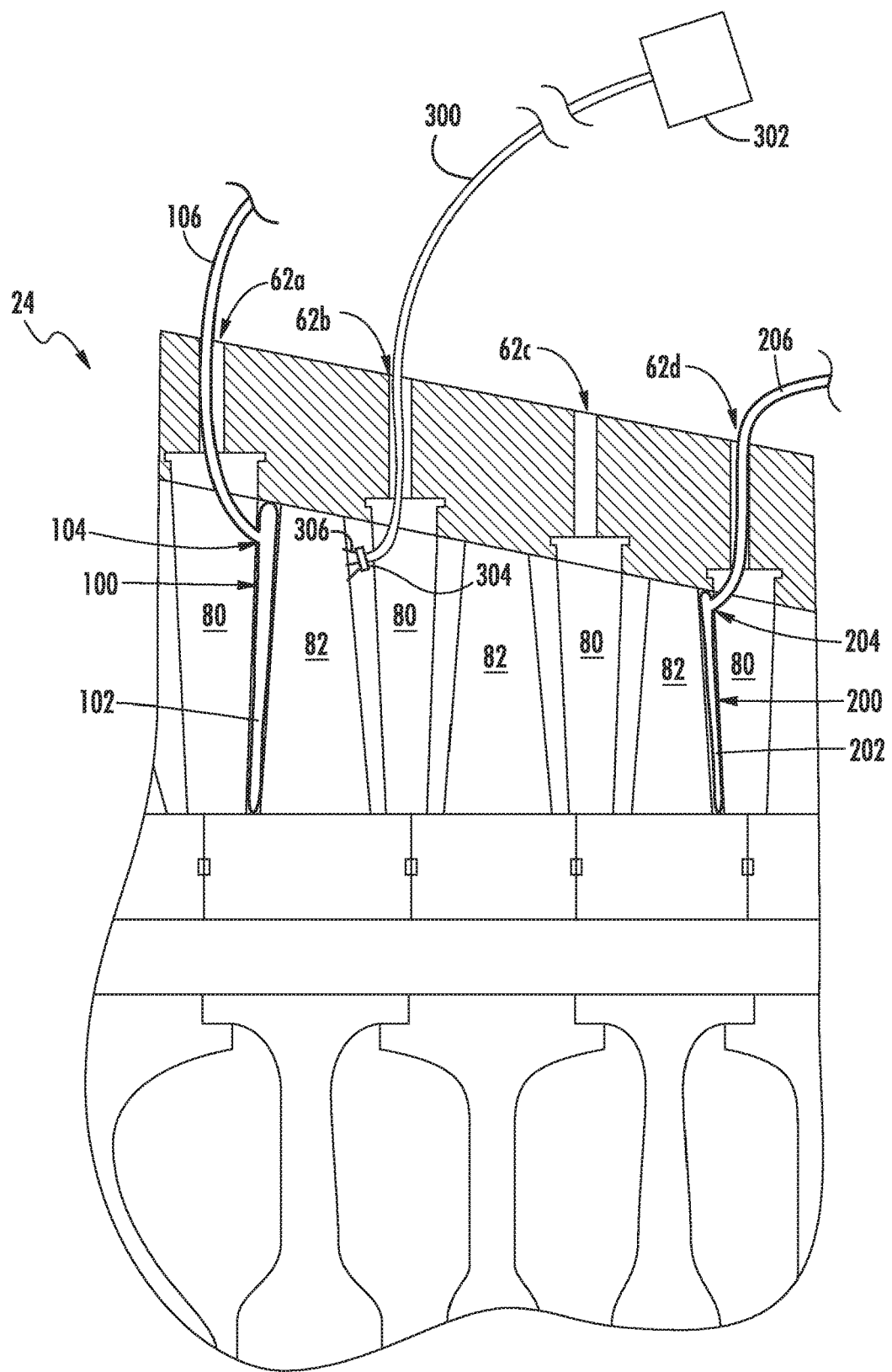
FIG. 3A illustrates a partial, cross-sectional view of one embodiment of a compressor suitable for use within the gas turbine engine shown in FIG. 1, particularly illustrating access ports defined in the engine for providing internal access to the compressor.
Figure 3B:
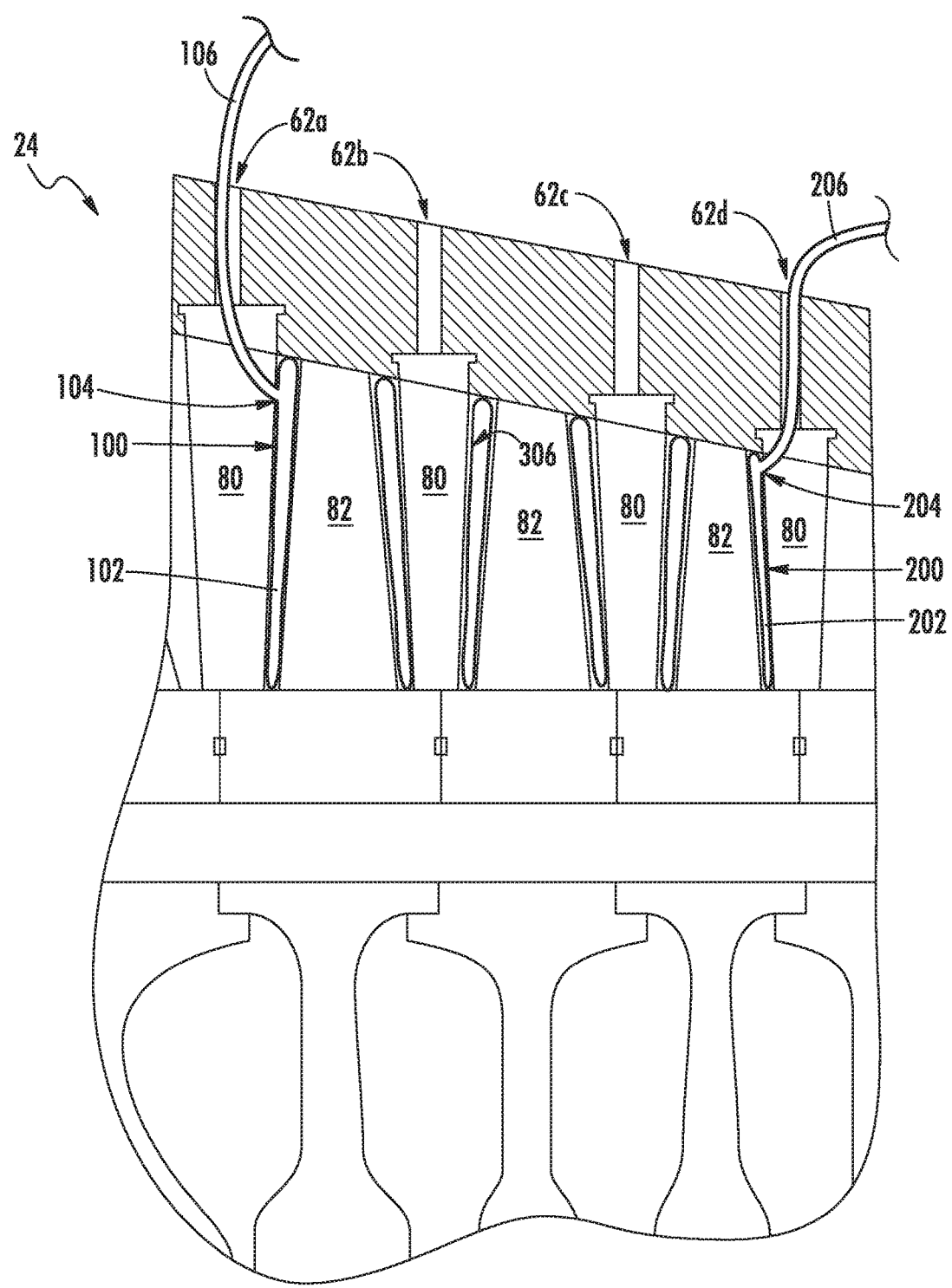
FIG. 3B illustrates a partial, cross-sectional view of the compressor of FIG. 3A with a masking agent coated on within the isolated area.
Figure 3C:
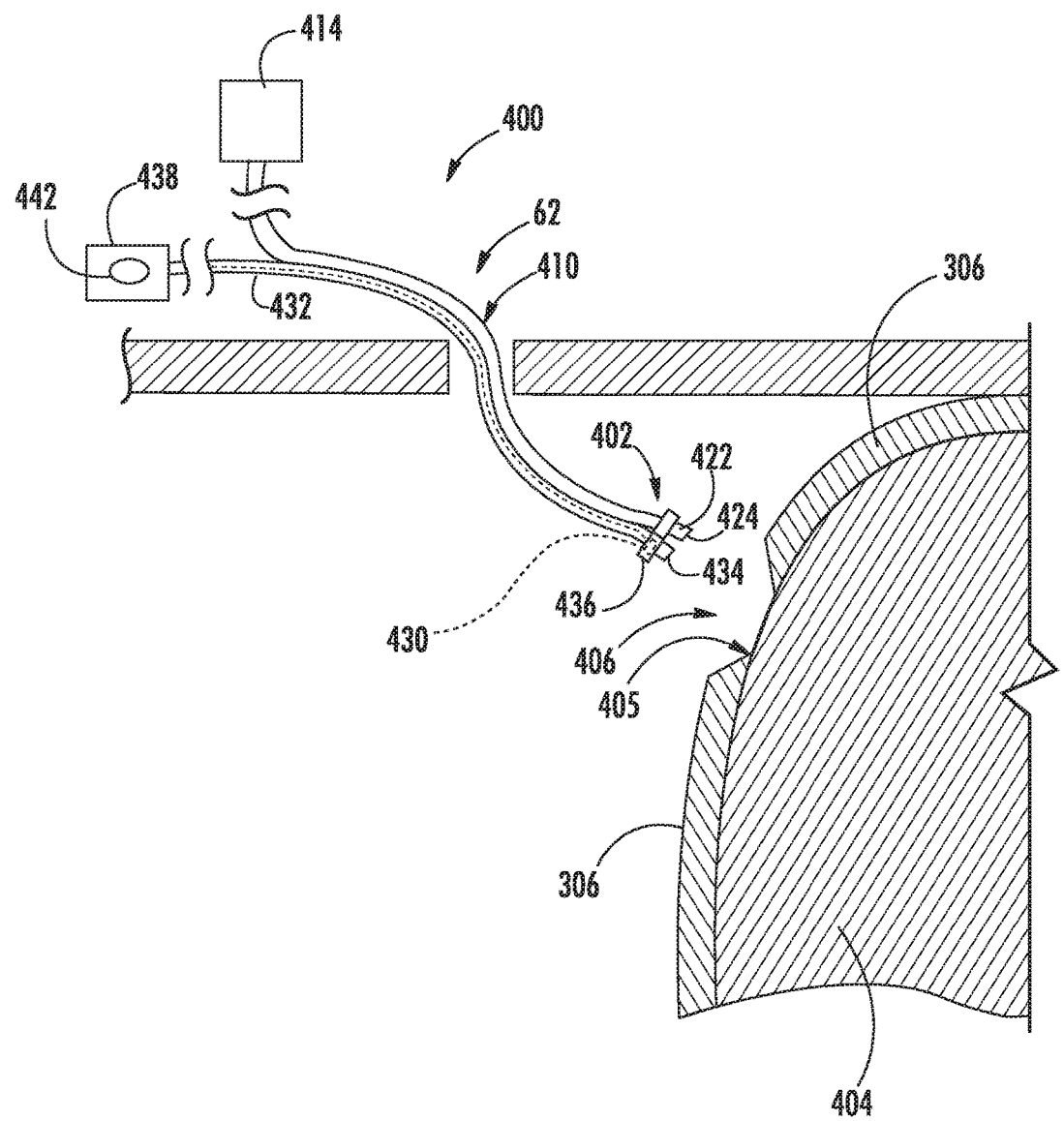
FIG. 3C illustrates a repair tool removing a portion of the masking agent on the surface as in FIG. 3C.
Figure 4:
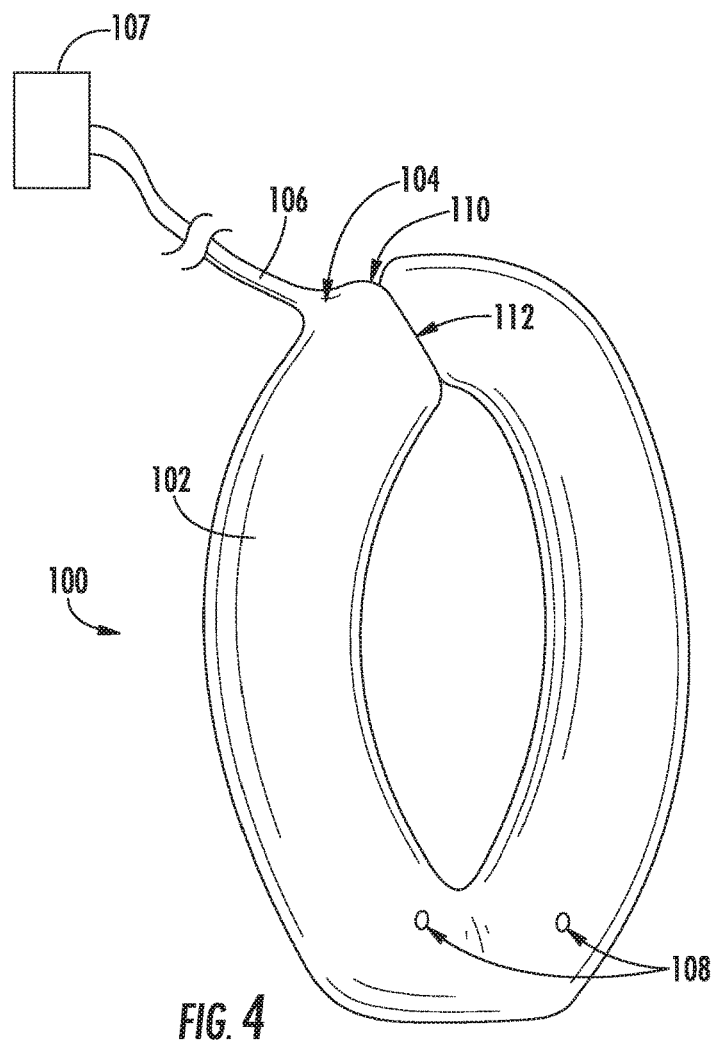
FIG. 4 illustrates a perspective view of an exemplary inflated bladder for use within the gas turbine engine shown in FIG. 1.

In the embodiments of FIGS. 2 and 3, the first bladder 100 and second bladder 200 can be inflated by supplying the fluid through an inlet 104, 204 through a supply tube 106, 206 from a fluid source 107, 207, respectively. In the embodiment of FIG. 4 with respect to the first bladder 100, the supply tube 106 is integral to the bladder body 102 so as to inflate the bladder body 102 between a first end 110 and a second end 112. Upon inflation, the bladder body 102 expands in its respective circumferential direction and in its respective longitudinal direction between the first end 110 and a second end 112. Thus, the inflated bladder body 102 fills the local space within the engine within which it is positioned. For example, the inflated bladder body 102 can extend between adjacent components within the engine (e.g., a row of stator vanes and an annular array of rotating blades, while contacting the arcuate outer band 72 and arcuate inner bands 74 as shown in FIG. 2). Additionally, the expansion in its respective longitudinal direction allows the bladder body 102 to expand circumferentially within the engine such that the first end 110 contacts the second end 112 to form a seal therebetween. In the embodiment shown, the inlet 104 is positioned at the first end 110 of the bladder body 102. In this embodiment, the second end 112 can be inserted as desired within the engine, with the bladder body 102 trailing. For example, the second end 112 can be attached to a fiber optic cable delivery system (not shown) and positioned within the engine as desired. However, in other embodiments, the inlet 104 can be positioned in another position on the bladder body 102.

In one embodiment, the material of the first and second bladders 100, 200 may be a fluid impermeable (e.g., a liquid impermeable material and/or a gas impermeable). In another embodiment, the material of the first and second bladders 100, 200 may be somewhat impermeable to the inflating fluid so as to allow for slow passing of the fluid through the bladders (e.g., at a flow through rate that is slower than the supply rate of the inflating fluid). The first and second bladders 100, 200 can be constructed of a deformable material, such as a plastic material (e.g., a plastic film, a plastic fibrous web, etc.), a rubber material, a paper material (e.g., a saturated paper material), or another material.

According to one embodiment, a masking material is introduced into the isolated area so as to coat all of the surfaces within the isolated area with a masking layer. For example, FIG. 3A shows a supply tube 300 connected to a supply source 302 and inserted through one of the access ports 62*b* so that an exit port 304 supplies a coating material 306 (e.g., a masking material) into the isolated area between the inflated bladders 100, 200 so as to coat all of the surfaces within the isolated area with the material 306, as shown in FIG. 3B. In one embodiment, the surfaces within the isolated area are coated via a vapor deposition process. Any suitable masking material can be utilized to form the coating onto the surfaces within the isolated area.

Then, the masking material 306 deposited on the surfaces of an internal component 204 can be removed in at least a portion 206 of the surface 205 of the component 204. Referring now to FIG. 3C, a simplified view of one embodiment of a system 400 for performing an in situ repair of an internal component of a gas turbine engine 10 are illustrated in accordance with aspects of the present subject matter. As shown, the system 400 may include a repair tool 402 configured to be inserted through an access port 62 of the gas turbine engine 10, such as any of the access ports 62 described above with reference to FIGS. 1-3, to allow an in situ repair procedure to be performed on an internal component(s) 404 (e.g., a blade 68 of the engine 10).

In general, the repair tool 402 may correspond to any suitable tool(s) and/or component(s) that may be inserted through an access port 62 of the gas turbine engine 10 and attach onto the surface 405 of the component 404 to perform precision work thereon. For example, a bladder 100 can temporarily secure the repair tool 402 within the engine so that the tool 402 can perform work at or near the surface 405 (e.g., at an identified defect of the internal engine component(s) 404 being repaired). As such, the repair tool 402 may be temporarily secured into a position so as to allow for precision work on the surface 405 (e.g., with precision accuracy within about 0.5 mm or less, such as about 0.25 mm or less). As generically shown in FIG. 3C, a conduit 410 is attached to a working head 422 includes a work mechanism 424 controllable via a controller 414 (e.g., a computer or other programmable machine).

The working head 422 includes a work mechanism 424 configured for addressing the component 404, as shown in FIG. 3C. In one embodiment, the working mechanism 442 can remove the deposited material 306 from the surface of the component 404 so as to expose the surface 405 in that portion 406. For example, the working mechanism can be a water jet, a grit blast, or another surface removal tool. Then, the working head 422 is positioned and secured adjacent to an identified defect of the internal engine component(s) 404 being repaired (e.g., a turbine blade(s)). For example, the defect can correspond to a crack, void or other defective area formed along the exterior of the component 404 that defines an open or fillable volume with a base of the crack, void or other defective area. The working head 422 includes a work mechanism 424 configured for addressing the component 404. In one embodiment, the new material can be supplied from a location exterior to the engine to the internal location of a defect to allow the fillable volume defined by the defect to be filled with the new material (e.g., a micro-plasma spray head). For example, the repair tool 402 can be configured to supply high velocity powder particles from the exterior of the engine into the fillable volume of the defect. Upon impacting a surface of the defect, the high velocity particles may plastically deform and adhere to the surface, thereby filling-in the fillable volume and repairing the defect. For example, the particles can impact the surface within the defect 106 at a speed of about 150 meters per second (m/s) to about 900 m/s. Such a process can build up material over the working area to increase its thickness.

The coating formed can be a thermal barrier coating or an environmental barrier coating, particularly where the working area (i.e., the surface exposed) is an exposed metal. In one embodiment, the working area can be the entire isolated area.

In one embodiment, the repair tool 402 also includes an optical probe 430 adjacent to the working head 422 and configured to be used in association with the repair tool 402. For instance, as shown in FIG. 4, the optical probe 430 corresponds to a separate component configured to be used in combination with the repair tool 402 for repairing the component 404. However, in other embodiments, the optical probe 430 may be coupled to or integrated within the repair tool 402. Additionally, as shown in FIG. 3C, the optical probe 430 has been inserted through the same access port 62 as the repair tool 402. However, in other embodiments, the probe 430 may be inserted into a different access port 62 than the repair tool 402, such as an access port 62 located adjacent to the access port 62 within which the repair tool 402 has been inserted.

In general, the optical probe 430 may correspond to any suitable optical device that allows images of the interior of the engine 10 to be captured or otherwise obtained. For instance, in several embodiments, the optical probe 430 may correspond to a borescope, videoscope, fiberscope or any other similar optical device known in the art that allows for the interior of a gas turbine engine 10 to be viewed through an access port 62. In such embodiments, the optical probe 430 may include one or more optical elements (indicated schematically by dashed box 432), such as one or more optical lenses, optical fibers, image capture devices, cables, and/or the like, for obtaining views or images of the interior of the engine 10 at a tip 434 of the probe 430 and for transmitting or relaying such images from the probe tip 434 along the length of the probe 430 to the exterior of the engine 10 for viewing by the personnel performing the repair procedure on the internal component(s) 404. In addition, the probe 430 may include a light source (indicated by dashed box 436) positioned at or adjacent to the probe tip 434 to provide lighting within the interior of the engine 10.

As shown in FIG. 3C, the optical probe 430 may also include an articulation assembly 438 that allows the orientation of the probe tip 434 to be adjusted within the interior of the gas turbine engine 10. For example, the articulation assembly 438 may allow for the probe tip 434 to be rotated or pivoted about a single axis or multiple axes to adjust the orientation of the tip 434 relative to the remainder of the probe 430. It should be appreciated that the articulation assembly 438 may generally have any suitable configuration and/or may include any suitable components that allow for adjustment of the orientation of the probe tip 434 relative to the remainder of the probe 430. For example, in one embodiment, a plurality of articulation cables 440 may be coupled between the probe tip 434 and one or more articulation motors 442. In such an embodiment, by adjusting the tension of the cables 140 via the motor(s) 442, the probe tip 434 may be reoriented within the gas turbine engine 10.

As shown in FIG. 3C, the component 404 is an airfoil tip with a known shape and size (e.g., a nozzle and/or blade). In other embodiments, the component 404 can be a trailing edge and/or leading edge of the airfoil.

The bladder 100 is installed within the engine 10, and in certain embodiments may form a circumferential seal therein. Referring to FIGS. 2 and 3A, the bladder 100 is installed and positioned adjacent to the between the plurality of first stage turbine nozzles 66 and the annular array of rotating turbine blades 68. For example, the first bladder 100 may be installed by inserting the first bladder 100, in an uninflated state, through one of the access ports 62. Then, the bladder 100 can be inflated using an inflating fluid, such as a liquid, foam, a gas from a source 107.

Generally, the bladder is inflated by supplying the fluid through an inlet 104 via a supply tube 106 from a fluid source 107. In the embodiment of FIG. 4 with respect to the bladder, the supply tube 106 is integral to the bladder body 102 so as to inflate the bladder body 102 between a first end 110 and a second end 112. Upon inflation, the bladder body 102 expands in its respective circumferential direction and in its respective longitudinal direction between the first end 110 and a second end 112. Thus, the inflated bladder body 102 fills the local space within the engine within which it is positioned. For example, the inflated bladder body 102 can extend between adjacent components within the engine (e.g., a row of stator vanes and an annular array of rotating blades, while contacting the arcuate outer band 72 and arcuate inner bands 74 as shown in FIG. 2). Additionally, the expansion in its respective longitudinal direction allows the bladder body 102 to expand circumferentially within the engine such that the first end 110 contacts the second end 112 to form a seal therebetween. In the embodiment shown, the inlet 104 is positioned at the first end 110 of the bladder body 102. In this embodiment, the second end 112 can be inserted as desired within the engine, with the bladder body 102 trailing. For example, the second end 112 can be attached to a fiber optic cable delivery system (not shown) and positioned within the engine as desired. However, in other embodiments, the inlet 104 can be positioned in another position on the bladder body 102.

In one embodiment, the material of the bladder 100 may be a fluid impermeable (e.g., a liquid impermeable material and/or a gas impermeable). In another embodiment, the material of the bladder 100 may be somewhat impermeable to the inflating fluid so as to allow for slow passing of the fluid through the bladders (e.g., at a flow through rate that is slower than the supply rate of the inflating fluid). The bladder 100 can be constructed of a deformable material, such as a plastic material (e.g., a plastic film, a plastic fibrous web, etc.), a rubber material, a paper material (e.g., a saturated paper material), or another material.

In one embodiment, at least one exit port 108 may be included in the bladder body 102 as shown in FIG. 4. Such an exit port 108 may be configured to supply the inflating fluid into the engine, particularly as in the embodiments shown in FIGS. 2 and 3 so as to supply the inflating fluid into the isolated area. As stated, the first bladder 100 can be inflated using an inflating fluid, such as a liquid, foam, a gas. For example, in one embodiment, the inflating fluid can include water, an inert gas, a cleaning fluid, a masking fluid, etc. In one embodiment, the inflating fluid can include particular material, such as masking material. For example, the masking can coat all of the surfaces within the isolated area. As such, the engine (e.g., the isolated compartment) may be exposed to a desired material, such as a cleaning agent, an abrasive agent, etc.

The inflating fluid can be supplied through the inlet 104 at a supply rate of fluid flow that is greater than (i.e., faster than) the fluid outflow rate through the exit ports 108. As such, the bladder body 102 may remain in its fully inflated state so as to keep the circumferential seal within the engine while still supplying the inflated fluid into the engine through the exit port 108.

Figure 5:
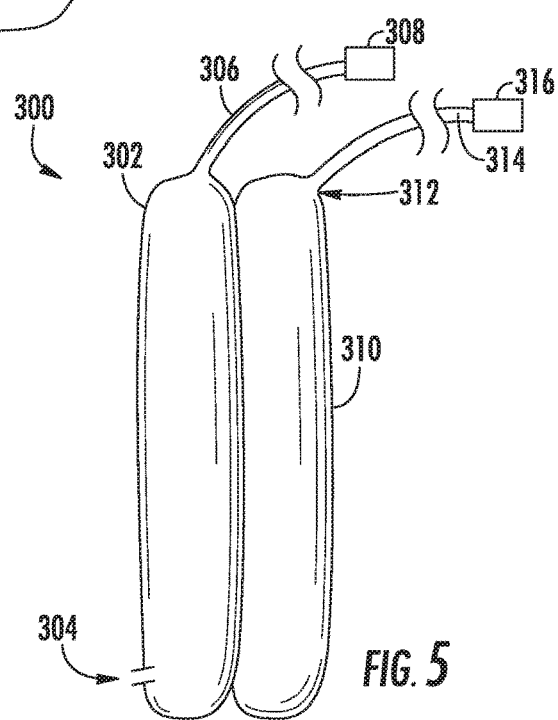
FIG. 5 illustrates a side view of another exemplary inflated bladder for use within the gas turbine engine shown in FIG. 1.

In one embodiment, the second bladder 200 may be configured to recover the fluid from within the isolated compartment. Referring to FIG. 5, an embodiment of a recovery bladder 300 is generally shown, which includes a first recovery body 302 having a recovery port 304 exposed to the isolated compartment. The first recovery body 302 can be in fluid communication with a pump 308, through recovery tube 306, to remove the inflating fluid from the isolated compartment supplied from the first bladder 100. The recovery bladder 300 can also include an adjacent to and/or attached to a third bladder body 310 inflated through the inlet 312 from the supply tube 314 and the supply tank 316. For example, the recovery bladder 300 can be an integrated double bladder that defines separate internal compartments (i.e., the recovery body 302 and the third bladder body 310). Through this configuration, the third bladder body 310 may provide structural stability during fluid recovery through the recovery body 302. However, in other embodiments, the recovery bladder 300 may include structural support members (not shown), internal and/or external to the bladder body 302.

Figure 6:
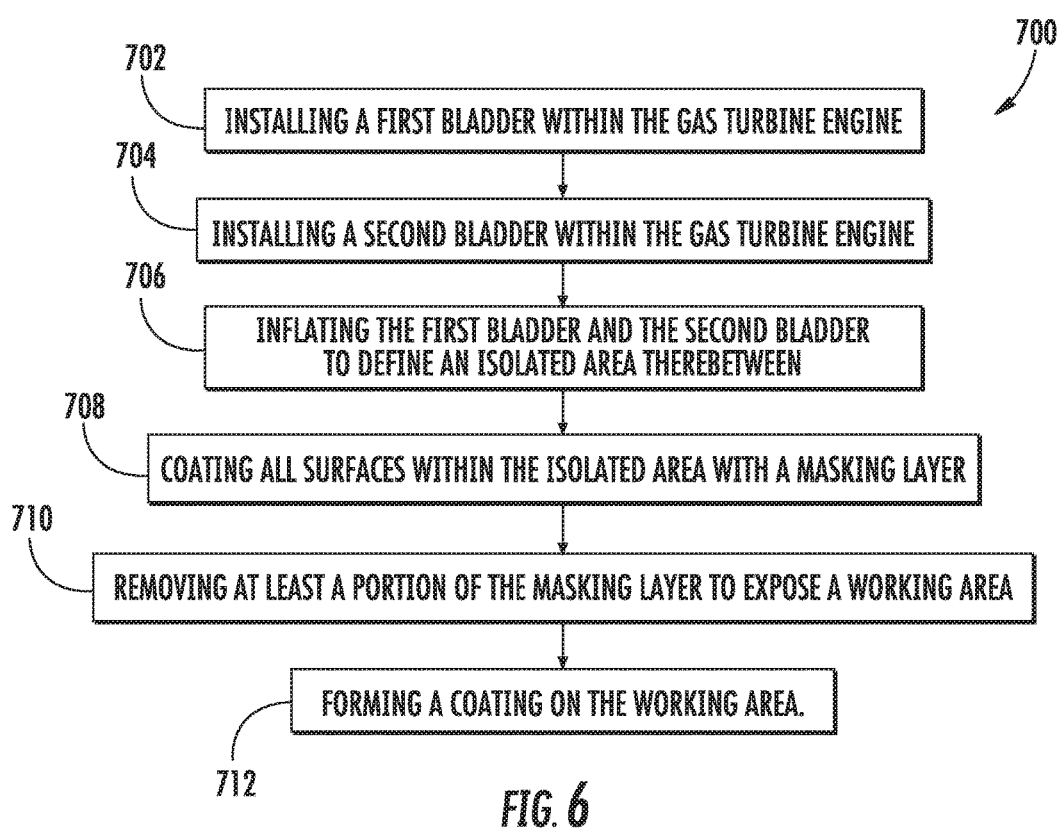
FIG. 6 shows a diagram of an exemplary method according to one embodiment.

FIG. 6 shows a diagram of an exemplary method 700 for repairing a surface of a component within a gas turbine engine. At 702, a first bladder is installed within the gas turbine engine, and a second bladder is installed within the gas turbine engine at 704. The first bladder and the second bladder is inflated, at 706, with an inflating fluid to form a first circumferential seal and a second circumferential seal to define an isolated area within the gas turbine engine. At 708, all surfaces are coated within the isolated area with a masking layer. At 710, at least a portion of the masking layer is removed to expose a working area, and a coating is formed on the working area at 712. Finally, after any work is done (e.g., forming a coating), the isolated area can be washed (e.g., with an acid rinse) to remove any remaining masking layer and/or any excess coating formed on the masking layer. Also, a plurality of coating can be formed on the working area (e.g., a bond coating and at least one barrier coating).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of repairing a surface of a component within a gas turbine engine, comprising:
installing a first bladder within the gas turbine engine;
installing a second bladder within the gas turbine engine;
inflating the first bladder and the second bladder with an inflating fluid to form a first circumferential seal and a second circumferential seal to define an isolated area within the gas turbine engine;
coating all surfaces within the isolated area with a masking layer;
removing at least a portion of the masking layer to expose a working area; and
forming a coating on the working area.

2. The method as in claim 1, wherein all surfaces within the isolated area are coated via a vapor deposition process.

3. The method as in claim 1, wherein removing a portion of the masking layer comprises grit blasting the working area.

4. The method as in claim 3, wherein a working head is inserted into the isolated area, the working head comprising a grit blast nozzle.

5. The method as in claim 4, wherein the grit blast nozzle is positioned at an end of a delivery cable.

6. The method as in claim 1, wherein forming a coating on the working area comprises directing a micro-plasma spray head over the working area to form the coating thereon.

7. The method as in claim 1, wherein the coating formed is a thermal barrier coating or an environmental barrier coating.

8. The method as in claim 1, wherein the working area is an exposed metal, wherein the coating formed on the working area comprises the metal.

9. The method as in claim 8, wherein the coating builds up material over the working area so as to increase its thickness.

10. The method as in claim 1, wherein the working area defines the entire isolated area.

11. The method as in claim 1, further comprising:
after forming the coating, washing the isolated area to remove any remaining masking layer and any excess coating formed thereon.

12. The method as in claim 11, wherein the isolated area is washed with an acid rinse.

13. The method as in claim 11, further comprising:
forming a plurality of coatings on the working area.

14. The method as in claim 13, wherein the plurality of coatings comprise a bond coating and at least one barrier coating.

15. A method of repairing a surface of a component within a gas turbine engine, the method comprising:
installing a first bladder within the gas turbine engine;
installing a second bladder within the gas turbine engine;
inflating the first bladder and the second bladder with an inflating fluid to form a first circumferential seal and a second circumferential seal to define an isolated area within the gas turbine engine;
cleaning the gas turbine engine within the isolated area; and
wherein cleaning the gas turbine engine within the isolated area comprises,
using a grit blast to remove a coating on components within the isolated area of the gas turbine engine.

16. The method as in claim 15, wherein the first bladder is positioned between a first row of blades and a first row of stator vanes to form the first circumferential seal therebetween.

17. The method as in claim 16, wherein the second bladder is positioned between a second row of blades and a second row of stator vanes to form the second circumferential seal therebetween.

18. The method as in claim 17, wherein cleaning the gas turbine engine within the isolated area comprises:
washing the isolated area to remove a coating on components within the isolated area.

19. The method as in claim 18, wherein the isolated area is washed with an acid to remove the coating on components within the isolated area.

* * * * *